United States Patent [19]
Doby

[11] Patent Number: 5,327,658
[45] Date of Patent: Jul. 12, 1994

[54] REGISTRATION BOARD ASSEMBLY

[76] Inventor: Richard Doby, 1730 Lakeview Ave., South Milwaukee, Wis. 53172

[21] Appl. No.: 945,823

[22] Filed: Sep. 15, 1992

[51] Int. Cl.$^5$ ............... B41B 11/00; G03B 27/14
[52] U.S. Cl. ........................ 33/621; 355/79; 355/91
[58] Field of Search ............. 33/614, 615, 616, 619, 33/620, 621, 623; 355/79, 91, 128

[56] References Cited

U.S. PATENT DOCUMENTS

| | | | |
|---|---|---|---|
| 3,400,630 | 9/1968 | Carlson . | |
| 3,634,009 | 1/1972 | Van Dusen | 355/73 |
| 3,751,817 | 8/1973 | Willis | 33/623 |
| 3,771,870 | 11/1973 | Taylor | 33/623 |
| 3,877,808 | 4/1975 | Jasperson, Jr. . | |
| 3,983,650 | 10/1976 | Payson . | |
| 4,533,240 | 8/1985 | Jasperson . | |
| 4,636,067 | 1/1987 | Richards, Sr. . | |
| 4,664,511 | 5/1987 | Carlson et al. . | |
| 4,736,538 | 4/1988 | Pierce et al. . | |
| 4,967,230 | 10/1990 | Meacham | 355/91 |
| 4,977,683 | 12/1990 | Harder | 33/621 |
| 5,023,659 | 6/1991 | Beasely | 355/79 |
| 5,138,772 | 8/1992 | Barnes | 33/613 |
| 5,255,052 | 10/1993 | Ternes et al. | 33/621 |

FOREIGN PATENT DOCUMENTS
2437596 2/1976 Fed. Rep. of Germany ........ 355/79

Primary Examiner—Thomas B. Will
Attorney, Agent, or Firm—Andrus, Sceales, Starke & Sawall

[57] ABSTRACT

The registration board assembly for pre-press printing proofs and printing plates includes a substantially planar layer or registration board, a backing layer adjacent and affixed to the planar layer, and a cavity formed between the planar layer and the backing layer. A register pin extends through an aperture in the planar layer. An elastomeric member such as a rubber diaphragm is disposed within the cavity and biases a barrel portion of the register pin through the planar layer aperture. The elastomeric member is mounted so that it is removable and replaceable. One way of mounting the elastomeric member is to provide a hole in the backing layer through which the elastomeric member is pulled to remove it. A new elastomeric member is then pushed through the backing layer hole. In a second embodiment, a threaded plug in the backing layer holds the elastomeric member in place. The threaded plug is removed to replace the elastomeric member. In a third embodiment, the backing layer is fastened to the registration board by one or more screw fasteners. The fasteners are removed to remove the backing layer when the elastomeric member is to be replaced.

8 Claims, 2 Drawing Sheets

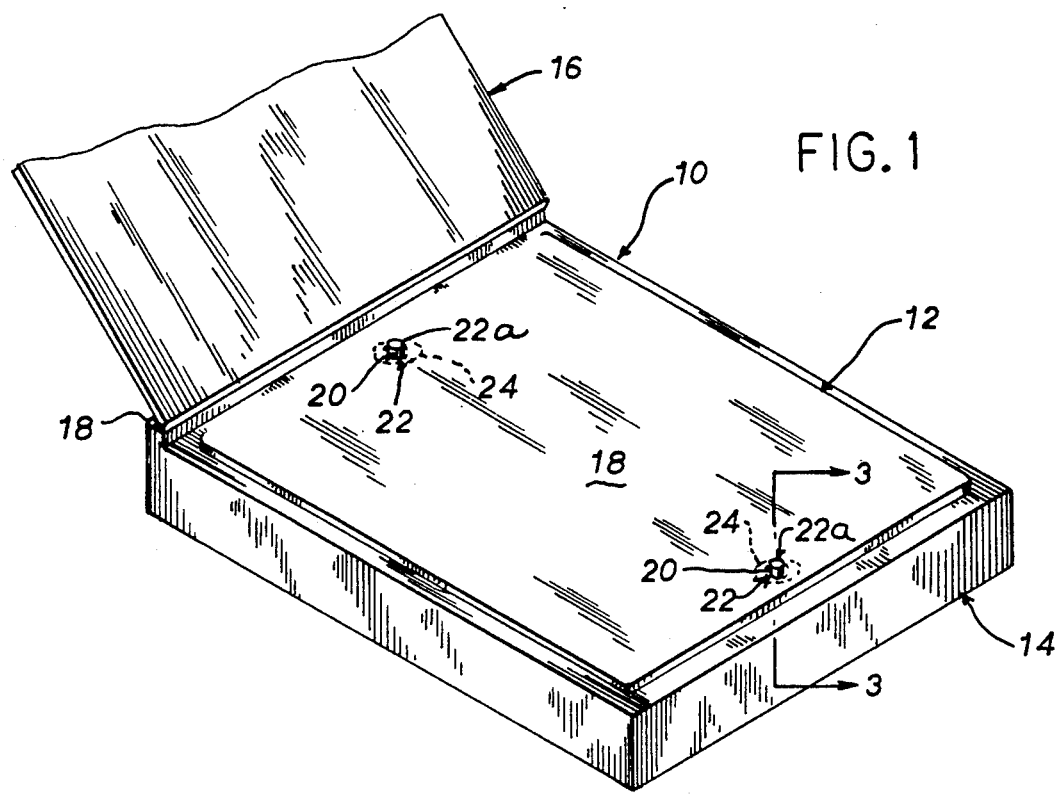
FIG. 1
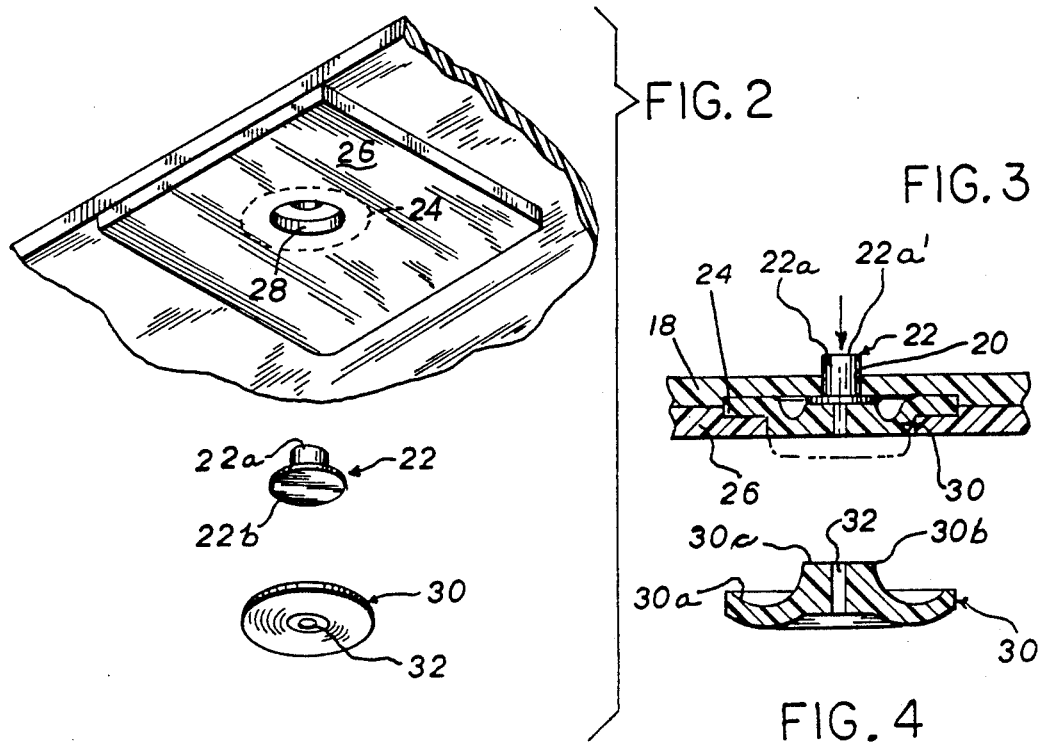
FIG. 2
FIG. 3
FIG. 4

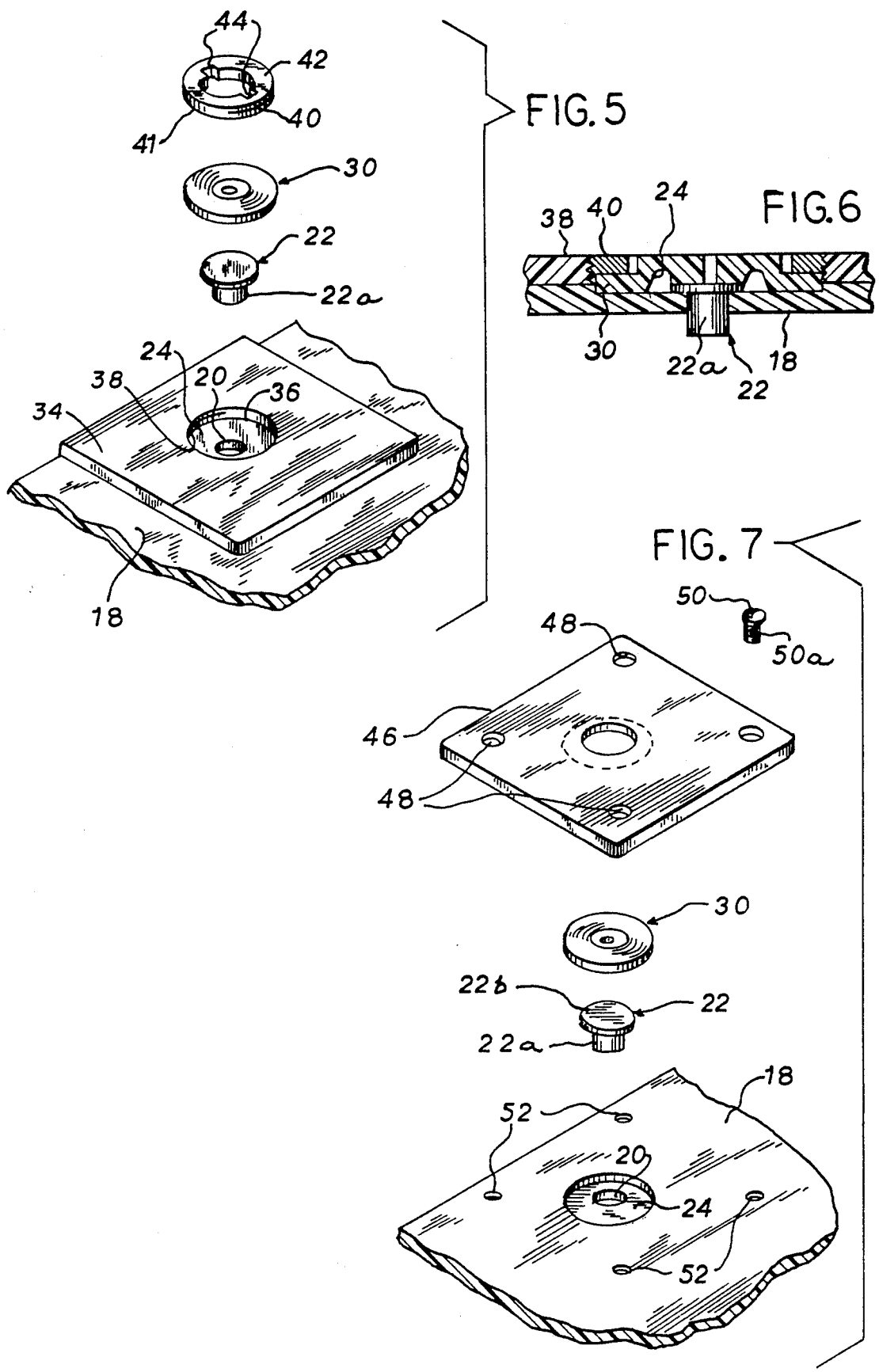

REGISTRATION BOARD ASSEMBLY

BACKGROUND OF THE INVENTION

This invention relates to devices used in the printing industry. More particularly, this invention relates to registration boards used to hold pre-press proofs and printing plates in proper alignment.

Registration board assemblies are known for laying out the proof of a page to be printed. A typical proof of a page, such as a magazine page, may have each article, photograph and the like set forth on its own single sheet of transparent film. If the magazine page has, for example, four articles and pictures, the proof may comprise four sheets.

Printing customers and the printers themselves often wish to view a proof of the page to be printed before the printing is performed. Since the proof may contain several sheets or layers, it is necessary to keep the layers properly aligned during the inspection. This is accomplished using a registration frame assembly having a frame structure, a registration board or a bottom layer with register pins protruding therefrom, and a glass or other transparent cover. The multiple sheets that comprise the pre-press proof page are aligned and placed on the register pins, and the cover of the registration board assembly is closed. A vacuum is then created in the closed registration frame assembly. The pre-press proof page may then be inspected with all the sheets or layers in their correct positions.

The register pin assemblies used in registration board assemblies are typically movable in the axial direction of the register pin so that the top of the register pin is flush with the proof page when the glass cover is closed. The register pin assembly moves in the axially downward direction when it is pressed by the glass cover, and moves in the axially upward direction when the glass cover is raised. The register pin assembly must typically be provided with a resilient elastomeric member to enable the pin to return to its original position.

After repeated use, however, the resiliency of the register pin assembly is often lost. The elastomeric member may lose its elasticity. In that event, it is often not possible to replace components of the register pin assembly without replacing the entire bottom layer and the entire register pin assembly.

Some prior art registration board assemblies used fixed or non-axially movable register pins in an effort to minimize the likelihood that the proof page layers will go out of alignment due to the axial movement of the register pin. Such prior art assemblies typically have a register pin securely mounted to a stiff planar registration board. A disadvantage of this design is that the registration board tends to split or break due to the repeated application of force from the glass cover on the register pin. The entire registration board and the register pin must then be replaced.

SUMMARY OF THE INVENTION

A registration board assembly for holding a pre-press proof or other image in proper alignment is disclosed in which the elastomeric, diaphragm member that allows the register pin to move in the axial direction may be readily removed and replaced. The high cost of replacing the entire registration board assembly is thus avoided.

In one embodiment of the present invention, the registration board assembly includes a substantially planar bottom layer having an aperture therein, and a backing layer adjacent and affixed to the planar layer near the aperture. The planar layer and/or backing layer has a cavity therein near the aperture. A register pin has a barrel portion that extends through the aperture in the planar layer. A base portion of the register pin is held in position by an elastomeric member, the latter being disposed in the cavity, between the backing layer and the register pin. The elastomeric member biases the barrel portion of the pin through said aperture.

The invention also includes a unique mounting means for removably mounting the elastomeric member within the cavity. In one embodiment, the mounting means includes a second aperture in the backing layer having a sufficient diameter such that the elastomeric member may be removed by pulling the elastomeric member through the second aperture without removing the backing layer. In this embodiment of the mounting means, the elastomeric member preferably includes a third aperture therein that is adapted to be engaged by a pulling tool, such as a wire, a small screwdriver or an ice pick. A new, replacement elastomeric member is then pressed through the second aperture.

In another embodiment, the mounting means includes an aperture in the backing layer, and a removable plug disposed within the backing layer aperture. The plug preferably has an outer surface having threads thereon which engage mating threads on the backing layer surface that defines the second aperture. The removable plug also preferably includes a keyway or other means that is designed to be engaged by a tool such as a screwdriver to rotate and remove the plug. Once the plug is removed, the elastomeric member may be pulled through the backing layer aperture, and a new elastomeric member may be inserted within the cavity. The plug is then replaced.

In a third embodiment of the present invention, the mounting means includes a plurality of removable fasteners, such as screws, that fasten the backing layer to the planar layer. Both the backing layer and the planar layer have respective pluralities of holes adapted to receive the fasteners. To replace the elastomeric member, the fasteners are removed, and the backing layer is then removed. The elastomeric member is then replaced and the backing layer is fastened back into position.

It is a feature and advantage of the present invention to provide a registration board assembly in which the elastomeric member is readily removed and replaced.

It is yet another feature and advantage of the present invention to provide a registration board assembly that is inexpensive and has a minimum number of parts.

These and other features and advantages of the present invention will be apparent to those skilled in the art from the following detailed description of the preferred embodiments and the drawings, in which:

BRIEF DESCRIPTION OF THE DRAWINGS

FIG. 1 is a perspective view of a registration frame assembly having a registration board assembly according to the present invention.

FIG. 2 is an exploded view of a first embodiment of the registration board assembly according to the present invention.

FIG. 3 is a cross sectional side view of the registration board assembly depicted in FIG. 2, taken along line 3—3 of FIG. 1

FIG. 4 is a cross sectional side view of the elastomeric member in its extended or non-depressed position.

FIG. 5 is an exploded view of a second embodiment of a registration board assembly according to the present invention.

FIG. 6 is a cross sectional side view of the second embodiment.

FIG. 7 is an exploded view of a third embodiment of the registration board assembly according to the present invention.

DETAILED DESCRIPTION OF THE PREFERRED EMBODIMENTS

FIG. 1 is a perspective view of a registration frame assembly incorporating the present invention. In FIG. 1, registration frame assembly 10 includes a registration board assembly 12, a support structure 14, a glass cover 16, and hinges 18 which connect support structure 14 to glass cover 16.

Registration board assembly 12 includes a registration board or planar layer 18 having two apertures 20 therein. Protruding through each of apertures 20 is a barrel portion 22a of a register pin 22. The dotted circles 24 in FIGS. 1 and 2 designate a cavity formed within planar layer 18 and backing layer 26 (FIG. 2).

Referring to FIGS. 2 through 4, backing layer 26 is adjacent and affixed to planar layer 18. Backing layer 26 may be formed integral with planar layer 18, may be bonded to planar layer 18, or may be otherwise affixed to planar layer 18.

Backing layer 26 has an aperture 28 therein that is substantially concentric with apertures 20 of planar layer 18. Aperture 28 has a sufficient diameter such that elastomeric member 30, when compressed or bent, may be pulled or pushed through aperture 28.

As best shown in FIGS. 3 and 4, cavity 24 is disposed at the interface between planar layer 18 and backing layer 26. Cavity 24 may comprise an indentation in planar layer 18, an indentation in backing layer 26, or indentations in both layers 18 and 26. In any case, cavity 24 is substantially circular in shape, and is sufficiently large to receive elastomeric member 30 and base portion 22b of register pin 22.

FIG. 3 more clearly depicts the position of elastomeric member 30 within cavity 24 as well as the position of register pin 22 within aperture 20. As shown by the arrow in FIG. 3, a force is applied to top surface 22a' of barrel portion 22. This force causes register pin 22 to move in an axially downward direction, thereby deforming elastomeric member 30. A portion of elastomeric member 30 extends through aperture 28 when the elastomeric member is deformed, as depicted in phantom in FIG. 3.

FIG. 4 depicts elastomeric member 30 in its normal, non-deformed position. Elastomeric member 30 has a substantially cylindrical base portion 30a and a trunk portion 30b. Elastomeric member 30 also has an aperture 32 formed in the axial direction through trunk portion 30b.

A key feature of the first embodiment is that elastomeric member 30 may be removed without removing backing layer 26. Elastomeric member 30 is pulled through aperture 28 by a tool (not shown) placed within aperture 32 and pressed against the sides of aperture 32 or hooked on top surface 30c. Such a tool may include a wire, a very small screwdriver, an ice pick, or a similar elongated member. Once elastomeric member 30 is firmly gripped, it is pulled through aperture 28. If elastomeric member 30 has lost some of its elasticity, it may be replaced with a new elastomeric member, which is compressed and pushed through aperture 28 into cavity 24.

FIG. 5 is an exploded view of a second embodiment of the present invention. In FIG. 5 as in all the Figures, corresponding components having similar functions have been given the same numerical designations.

In FIG. 5, backing layer 34 has an aperture 36 therein that is formed concentric with aperture 20 in planar layer 18. The sides of aperture 36 are preferably threaded with threads 38 (FIG. 6), which engage mating threads 40 formed on outer surface 41 of a plug 42. In this second embodiment, cavity 24 is substantially coincident with aperture 36.

In FIG. 5, barrel portion 22a of register pin 22 is disposed in aperture 20, and elastomeric member 30 is disposed within cavity 24. Plug 42 is aligned over aperture 36, and is inserted by placing a tool (not shown) in keyway 44 of plug 42. Plug 42 is then rotated by the tool so that threads 40 engage threads 38, until elastomeric member 30 and register pin 22 are secure in their proper positions.

To remove elastomeric member 30 and/or pin 22, plug 42 is rotated in the opposite direction by again placing a tool, such as a screwdriver, in keyway 44 and rotating the plug. Elastomeric member 30 may then be replaced as needed.

FIG. 7 is an exploded view of a third embodiment of the present invention wherein the backing layer itself is removable to remove and replace the elastomeric member. In FIG. 7, backing plate 46 includes a plurality of apertures 48 therein, each of which is designed to receive a fastener 50, only one of the fasteners being shown in FIG. 7. Aligned with holes 48 is a corresponding plurality of holes 52 in planar layer 18. Barrel portion 22a of register pin 22 is placed within aperture 20, and elastomeric member 30 is then placed in cavity 24 next to base portion 22b of register pin 22. Backing plate 46 is then placed adjacent to planar layer 18 such that holes 48 are aligned with holes 52. Fasteners 50 are then threaded through holes 48 into holes 52 to attach backing plate 46 to planar layer 18.

To remove and replace elastomeric member 30, fasteners 50 are rotated until their threads 50a are disengaged from holes 52 and holes 48. Backing plate 46 is then removed, allowing elastomeric member 30 to be removed and replaced, as needed.

While several preferred embodiments of the present invention have been shown and described, alternate embodiments will be apparent to those skilled in the art and are within the intended scope of the present invention. Therefore, the invention is to be limited only by the following claims.

I claim:

1. A registration board assembly for holding an image in proper alignment, comprising:
    a substantially planar layer having at least one aperture therein;
    a backing layer adjacent to said planar layer;
    a cavity between said planar layer and said backing layer and adjacent to said planar layer aperture;
    a register pin having a barrel portion that extends through said aperture and having a base portion disposed in said cavity;
    an elastomeric member, disposed in said cavity between said backing layer and said pin, that biases said barrel portion through said aperture and that maintains said base portion in said cavity; and mounting means for removably mounting said elastomeric member within said cavity.

2. The registration board assembly of claim 1, wherein said mounting means includes:

a second aperture in said backing layer, having a sufficient diameter such that said elastomeric member may be removed by pulling said elastomeric member through said second aperture without removing said backing layer.

3. The registration board assembly of claim 2, wherein said elastomeric member includes:

a third aperture therein adapted to be engaged by a pulling tool.

4. The registration board assembly of claim 1, wherein said mounting means includes:

a second aperture in said backing layer; and a removable plug disposed within said second aperture.

5. The registration board assembly for holding an image in proper alignment, comprising:

a substantially planar layer having at least one aperture therein;

a backing layer adjacent to said planar layer;

a cavity between said planar layer and said backing layer and adjacent to said planar layer aperture;

a register pin having a barrel portion that extends through said aperture;

an elastomeric member, disposed in said cavity between said backing layer and said pin, that biases said barrel portion through said aperture;

a second aperture in said backing layer;

a removable plug disposed within said second aperture, the removable plug including an outer surface having at least one thread thereon; and means for engaging a tool to rotate and remove said plug.

6. The registration board assembly of claim 5, wherein said engaging means is a keyway.

7. A registration board assembly for holding an image in proper alignment, comprising:

a substantially planar layer having at least one aperture therein;

a backing layer adjacent to said planar layer;

a cavity between said planar layer and said backing layer and adjacent to said planar layer aperture;

a register pin having a barrel portion that extends through said aperture;

an elastomeric member, disposed in said cavity between said backing layer and said pin, that biases said barrel portion through said aperture;

at least one fastener that fastens said backing layer to said planar layer; and at least one first hold in said backing layer and at least one second hole in said planar layer adapted to receive said at least one fastener.

8. The registration board assembly of claim 7, wherein said fastener is a screw.

* * * * *

UNITED STATES PATENT AND TRADEMARK OFFICE
CERTIFICATE OF CORRECTION

PATENT NO. :     5,327,658
DATED      :     July 12, 1994
INVENTOR(S) :    Doby

It is certified that error appears in the above-indentified patent and that said Letters Patent is hereby corrected as shown below:

CLAIM 5, Col. 5, Line 21, delete "The" and substitute therefor ---A---; CLAIM 7, Col. 6, Line 26, delete "hold" and substitute therefor ---hole---.

Signed and Sealed this

Twenty-seventh Day of September, 1994

Attest:

BRUCE LEHMAN

Attesting Officer

Commissioner of Patents and Trademarks